(12) United States Patent
Odaka

(10) Patent No.: US 10,367,047 B2
(45) Date of Patent: Jul. 30, 2019

(54) DISPLAY DEVICE

(71) Applicant: Japan Display Inc., Tokyo (JP)

(72) Inventor: Kazuhiro Odaka, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 15/852,547

(22) Filed: Dec. 22, 2017

(65) Prior Publication Data

US 2018/0212009 A1 Jul. 26, 2018

(30) Foreign Application Priority Data

Jan. 20, 2017 (JP) ................................. 2017-008735

(51) Int. Cl.
| | |
|---|---|
| *H01L 27/12* | (2006.01) |
| *H01L 27/32* | (2006.01) |
| *H01L 51/50* | (2006.01) |
| *H01L 51/52* | (2006.01) |
| *G02F 1/1333* | (2006.01) |
| *G02F 1/1362* | (2006.01) |

(52) U.S. Cl.
CPC .... *H01L 27/3258* (2013.01); *G02F 1/133345* (2013.01); *G02F 1/136227* (2013.01); *H01L 27/3246* (2013.01); *H01L 27/3276* (2013.01); *H01L 51/5012* (2013.01); *H01L 51/5206* (2013.01); *H01L 51/5246* (2013.01); *H01L 27/124* (2013.01); *H01L 27/3262* (2013.01)

(58) Field of Classification Search
CPC . H01L 27/3258; H01L 27/12; H01L 27/3246; H01L 27/3276; H01L 51/5012; H01L 51/5206; H01L 51/5246; G02F 1/133345; G02F 1/136227
See application file for complete search history.

(56) References Cited

U.S. PATENT DOCUMENTS

2011/0199564 A1* 8/2011 Moriwaki ......... G02F 1/136227
349/122

FOREIGN PATENT DOCUMENTS

WO 2010/038514 A1 4/2010

* cited by examiner

*Primary Examiner* — Nathanael R Briggs
(74) *Attorney, Agent, or Firm* — Michael Best & Friedrich LLP

(57) ABSTRACT

A display device in an embodiment according to the present invention includes a display region above a first substrate, the display region includes, a plurality of a pixels, a transistor arranged to each of the plurality of the pixels, a light emitting element arranged to each of plurality of the pixels, an interlayer insulating layer above the transistor, and a planarization film above the inter layer insulating layer, a terminal region above the first substrate in a periphery region of the display region, the terminal region including, a plurality of terminals, each of which includes a first conductive layer above the interlayer insulating layer, the planarization film is arranged in a side part of the first conductive layer, and an inorganic insulating layer covering an upper surface of planarization film and an end part of the first conductive layer.

20 Claims, 12 Drawing Sheets

DISPLAY DEVICE

CROSS REFERENCE TO RELATED APPLICATIONS

This application is based upon and claims the benefit of priority from the prior Japanese Patent Application No. 2017-008735, filed on Jan. 20, 2017, the entire contents of which are incorporated herein by reference.

FIELD

An embodiment of the present invention is related to a terminal part of a display device.

BACKGROUND

Conventionally, an organic EL display device (Organic Electroluminescence Display) using an organic electroluminescence material (organic EL material) for a light emitting element (organic EL element) in a display part is known as a display device. Unlike a liquid crystal display device or the like, an organic EL display device is a so called self-light emitting type display device which realizes display by making an organic EL material emit light.

In such an organic EL display device, an FPC is crimped onto a terminal part of an organic EL display panel via an anisotropic conductive film (ACF), and thereby the organic EL display panel and the flexible circuit substrate (Flexible Printed Circuit: FPC) are connected. At this time, the terminal part and the flexible circuit substrate are electrically connected by conductive particles included in the anisotropic conductive film.

A structure in which an organic insulating film is arranged above wiring which forms the terminal part, the wiring and a pad part are connected to each other in an opening part of the organic insulating film, and the pad part is connected to the flexible circuit substrate via conductive particles included in the anisotropic conductive film is disclosed (WO2010/038514).

SUMMARY

A display device in an embodiment according to the present invention includes a display region above a first substrate, the display region includes, a plurality of a pixels, a transistor arranged to each of the plurality of the pixels, a light emitting element arranged to each of plurality of the pixels, an interlayer insulating layer above the transistor, and a planarization film above the inter layer insulating layer, a terminal region above the first substrate in a periphery region of the display region, the terminal region including, a plurality of terminals, each of which includes a first conductive layer above the interlayer insulating layer, the planarization film is arranged in a side part of the first conductive layer, and an inorganic insulating layer covering an upper surface of planarization film and an end part of the first conductive layer, wherein a part of an upper surface of the first conductive layer is exposed from the inorganic insulating layer, and the upper surface of the planarization film is lower than the upper surface of the first conductive layer.

A display device in an embodiment according to the present invention includes a display region above a first substrate, the display region includes, a plurality of a pixels, a transistor arranged to each of the plurality of the pixels, a light emitting element arranged to each of the plurality of the pixels, an interlayer insulating layer above the transistor; and a planarization film above the interlayer insulating layer, a terminal region above the first substrate in a periphery region of the display region, the terminal region including, a plurality of terminals, each of which includes a first conductive layer above the first substrate, and a second conductive layer above the interlayer insulating layer, and an inorganic insulating layer above the planarization film, wherein the first conductive layer is connected with the second conductive layer via a first opening part of the interlayer insulating layer, the inorganic insulating layer covers an upper surface of the planarization film and an end part of the second conductive layer, a part of an upper surface of the second conductive layer is exposed from the inorganic insulating layer, and the upper surface of the planarization film is lower than the upper surface of the second conductive layer.

A display device in an embodiment according to the present invention includes a display region above a first substrate, the display region includes, a plurality of a pixels, a transistor arranged to each of the plurality of the pixels, a light emitting element arranged to each of the plurality of the pixels, an interlayer insulating layer above the transistor; and a planarization film above the interlayer insulating layer, a terminal region above the first substrate in a periphery region of the display region, the terminal region including, a plurality of terminals, each of which includes a first conductive layer above the interlayer insulating layer, and a transparent conductive layer above the first conductive layer, and an inorganic insulating layer covering an upper surface of the planarization film an end part of the transparent conductive layer and an end part of the first conductive layer, wherein the planarization film covers a side portion of the first conductive layer, a part of an upper surface of the first conductive layer is exposed from the inorganic insulating layer, and the upper surface of the planarization film is lower than the upper surface of the first conductive layer.

A display device in an embodiment according to the present invention includes a display region above a first substrate, the display region including a plurality of a pixels, a transistor arranged to each of the plurality of the pixels, a light emitting element arranged each of the plurality of the pixels, an interlayer insulating layer above the transistor, and a planarization film above the interlayer insulating layer, a terminal region above the first substrate in a periphery region of the display region, the terminal region including, a plurality of terminals, each of which includes a first conductive layer above the first substrate, a second conductive layer above the interlayer insulating layer, a transparent conductive layer above the second conductive layer, and an inorganic insulating layer above the planarization film, wherein the first conductive layer is connected with the second conductive layer via a first opening part of the interlayer insulating layer, the inorganic insulating layer covers an upper surface of the planarization film and an end part of the first conductive layer and an end of the transparent conductive layer, an upper surface of the transparent conductive layer is exposed from the inorganic insulating layer, and the upper surface of the planarization film is lower than the upper surface of the second conductive layer.

DESCRIPTION OF EMBODIMENTS

Each embodiment of the present invention is explained below while referring to the diagrams. However, it is possible to perform the present invention using various different forms within a scope that does not depart from the concept of the present invention and the present invention should not be limited to the content described in the embodiments exemplified herein. In addition, although the width, thickness and shape of each component are shown schematically compared to their actual form in order to better clarify explanation, the drawings are merely an example and should not limit an interpretation of the present invention. Furthermore, in the specification and each drawing, the same reference symbols are attached to similar elements and elements that have been mentioned in previous drawings, and therefore a detailed explanation may be omitted where appropriate.

In the present invention, when a single film is processed to form a plurality of films, these films may have different functions and roles. However, the plurality of films are derived from films formed in the same layer by the same process and have the same layer structure and the same material. Therefore, these films are defined as existing in the same layer.

Furthermore, in the present specification, expressions such as "upper", "lower" and the like when explaining the drawings express a relative positional relationship between the structure of interest and other structures. In the present specification, in a side view, the direction from an insulating surface to be described herein to a bank is defined as "upper", and the opposite direction is defined as "lower". In the present specification and the scope of he claims, in the case of simply denoting "above" when expressing a mode of in which another structure is arranged on a certain structure, unless otherwise noted a case where another structure is arranged directly above a certain structure as if in contact with that structure, and a case where another structure is arranged via another structure above a certain structure, are both included.

(First Embodiment)

Figure 1:
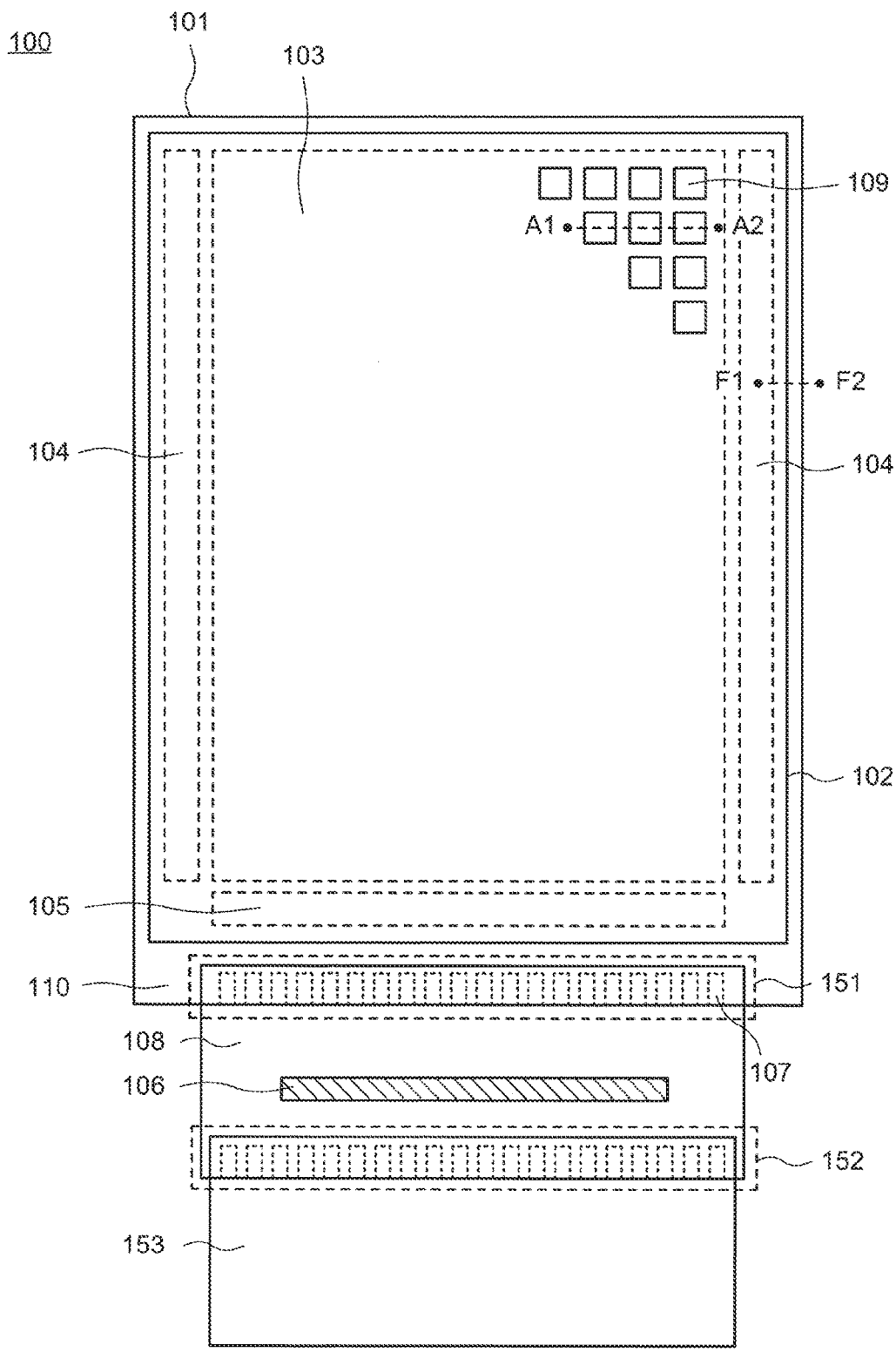
FIG. 1 is a schematic view showing a structure of a display device related to one embodiment of the present invention.

FIG. 1 is a schematic view showing a structure of a display device 100 according to one embodiment of the present invention, and shows a schematic structure in the case when the display device 100 is seen in a planar view. In the present specification, a state of the display device 100 as seen from a direction perpendicular to the screen (display region) is referred to as "planar view".

As shown in FIG. 1, the display device 100 includes a display region 103, a scanning line drive circuit 104, a data line drive circuit 105, and a driver IC 106 formed on an insulating surface. The driver IC 106 functions as a control part which provides signals to the scanning line drive circuit 104 and the data line drive circuit 105. The data line drive circuit 105 may be incorporated within the driver IC 106. In addition, although the driver IC 106 is externally arranged on a COF 108 (Chip On Film) by a COF method, it may also be arranged on the first substrate 101. The COF 108 is connected to a terminal 107 arranged in a periphery region 110. In addition, the COF 108 is connected to a FPC 153 via a terminal part 152. In addition, chip resistors and chip capacitors are mounted on the FPC 153.

Here, the insulating surface is a surface of a first substrate 101. The first substrate 101 supports each layer such as a pixel electrode and an insulating layer arranged on the surface of the substrate. Furthermore, the first substrate 101 itself may be made of an insulating material and may have an insulating surface or an insulating layer may be separately formed on the first substrate 101 to form an insulating surface. The material of the first substrate 101 and the material for forming the insulating film are not particularly limited as long as it is possible to obtain an insulating surface.

A plurality of pixels 109 are arranged in a matrix in the display region 103 shown in FIG. 1. Each pixel 109 includes a light emitting element having a pixel electrode (anode), an organic layer (light emitting part) including a light emitting layer stacked above the pixel electrode, and a counter electrode (cathode). Image signals is provided to each pixel 109 from the data line drive circuit 105. According to the image signals, a transistor electrically connected to the pixel electrode arranged in each pixel 109 is driven to display a screen according to the image signals. Typically, it is possible to use a thin film transistor (TFT) as the transistor. However, the present embodiment is not limited to a thin film transistor and any element may be used as long as it has a current control function.

<Pixel Structure>

Figure 2:
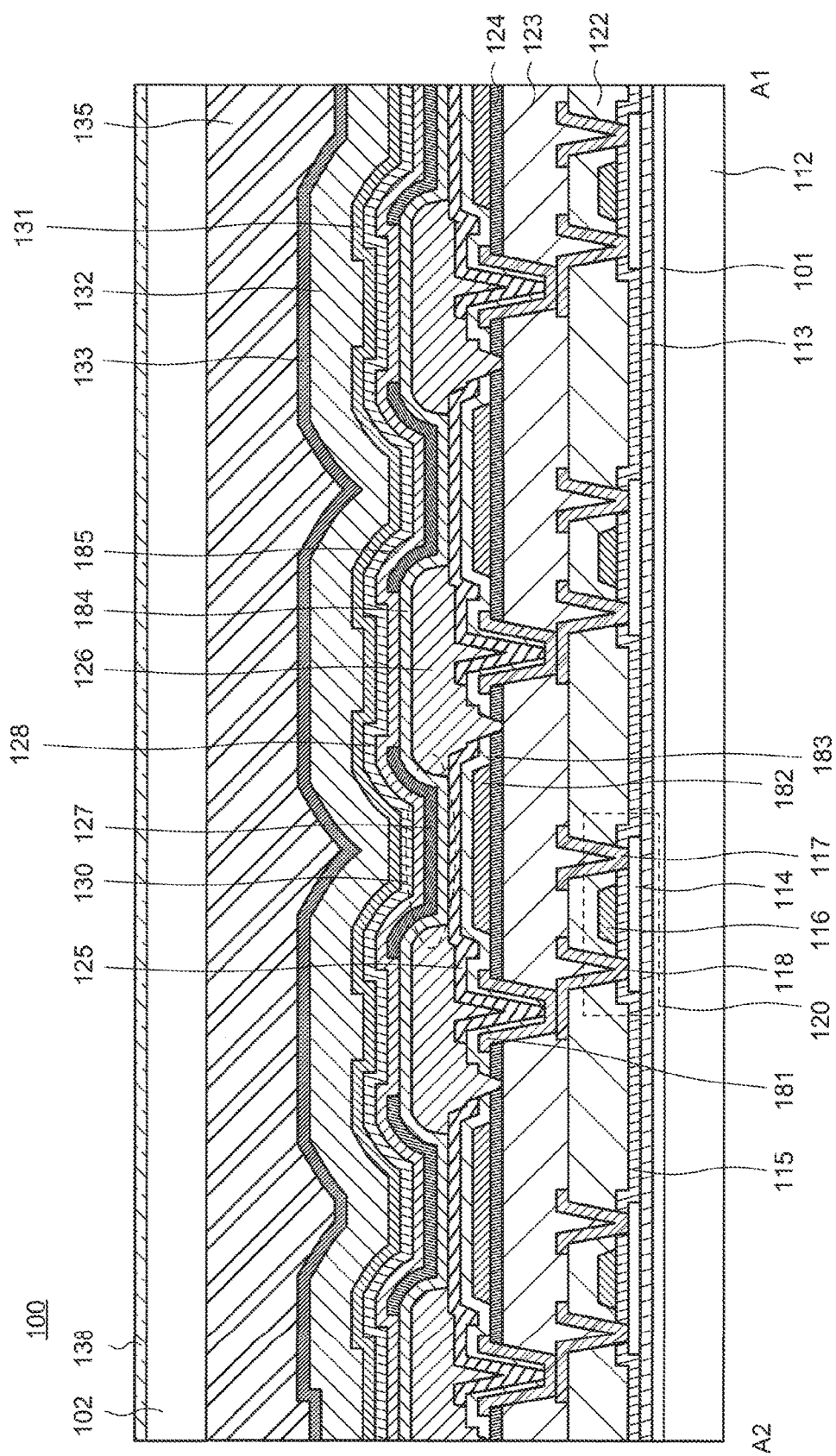
FIG. 2 is a cross-sectional view along the line A1-A2 in FIG. 1.

FIG. 2 is a diagram showing an example of a structure of a pixel in the display device 100 according to the first embodiment. Specifically, it is a diagram showing a structure of a cross-section view taken along the line A1-A2 of the display region 103 shown in FIG. 1. A cross-section view of three light emitting elements 130 as a part of the display region 103 is shown in FIG. 2. Although three light emitting elements 130 are exemplified in FIG. 2, in reality, in the display region 103, several million or more light emitting elements are arranged in a matrix shape corresponding to the pixels.

As shown in FIG. 2, the display device 100 includes a first substrate 101, a second substrate 112, and a counter substrate 102. A glass substrate, a quartz substrate, a flexible substrate (polyimide, polyethylene terephthalate, polyethylene naphthalate, triacetyl cellulose, a cyclic olefin copolymer, a cycloolefin polymer, or other resin substrate having flexibility) can be used as the first substrate 101, the second substrate 112 and the counter substrate 102. It is also possible to use a metal substrate, a ceramic substrate, or a semiconductor substrate in the case when it is not necessary for the first substrate 101, the second substrate 112, and the counter substrate 102 to have translucency. In the present embodiment, a case where polyimide is used as the first substrate 101 and polyethylene terephthalate is used as the second substrate 112 and the counter substrate 102 is explained.

An underlying film 113 is arranged above the first substrate 101. The underlying film 113 is an insulating layer made of an inorganic material such as silicon oxide, silicon nitride or aluminum oxide or the like. The underlying film 113 is not limited to a single layer and may have a stacked structure in which, for example, a silicon oxide layer and a silicon nitride layer are combined. This structure may be appropriately determined considering adhesion to the first substrate 101 and gas barrier properties to the transistor 120 described herein.

A transistor 120 is arranged above the underlying film 113. The structure of the transistor 120 may be a top gate type or a bottom gate type. In the present embodiment, the transistor 120 includes a semiconductor layer 114 arranged above the underlying film 113, a gate insulating film 115 covering the semiconductor layer 114, and a gate electrode 116 arranged above the gate insulating film 115. In addition, above the transistor 120, an interlayer insulating layer 122 covering the gate electrode 116, a source or drain electrode 117 and a source or drain electrode 118. A source or drain electrode 117 and a source or drain electrode 118 are connected to the semiconductor layer 114. In the present embodiment, although an example in which the interlayer insulating layer 122 has a single layer structure is explained, the interlayer insulating layer 122 may also have a stacked structure.

Furthermore, the material of each layer forming the transistor 120 may be any known material and is not particularly limited. For example, generally, polysilicon, amorphous silicon or an oxide semiconductor can be used as the semiconductor layer 114. Silicon oxide or silicon nitride can be used as the gate insulating film 115. The gate electrode 116 is formed of a metal material such as copper, molybdenum, tantalum, tungsten or aluminum. Silicon oxide or silicon nitride can be used as the interlayer insulating layer 122. The source or drain electrode 117 and the source or drain electrode 118 are each formed from a metal material such as copper, titanium, molybdenum or aluminum.

Furthermore, although not shown in FIG. 2, it is possible to arrange a first wiring formed of the same metal material as the metal material forming the gate electrode 116 in the same layer as the gate electrode 116. The first wiring can be arranged as, for example, a scanning line driven by the scanning line drive circuit 104 or the like. In addition, although not shown in FIG. 2, a second wiring extending in a direction intersecting the first wiring can be arranged in the same layer as the source or drain electrode 117 and the source or drain electrode 118. The second wiring can be arranged, for example, as a data line or the like driven by the data line drive circuit 105.

A planarization film 123 is arranged above the transistor 120. The planarization film 123 is formed including an organic resin material. For example, known organic resin materials such as polyimide, polyamide, acrylic, epoxy and the like can be used as the organic resin material. These materials can form a film by a solution coating method and have a feature that a flattening effect is high. Although not specifically shown in the diagram, the planarization film 123 is not limited to a single layer structure and may also have a stacked structure of a layer containing an organic resin material and an inorganic insulating layer.

The planarization film 123 has a contact hole exposing a part of the source or drain electrode 118. The contact hole is an opening part for electrically connecting a pixel electrode 125 described herein and the source or drain electrode 118. Therefore, the contact hole is arranged to overlap a part of the source electrode or the drain electrode 118. The source or drain electrode 118 is exposed at the bottom surface of the contact hole.

A protective film 124 is arranged above the planarization film 123. The protective film 124 overlaps the contact hole formed in the planarization film 123. The protective film 124 is preferred to have barrier properties against moisture and oxygen, and is formed using, for example, an inorganic insulating material such as a silicon nitride film or aluminum oxide.

A transparent conductive layer 181 is arranged above the protective film 124. The transparent conductive layer 181 overlaps the contact hole of the planarization film 123 and the protection film 124 and is electrically connected to the source or drain electrode 118 exposed at the bottom of the contact hole. An indium oxide based transparent conductive layer (for example, ITO) or a zinc oxide based transparent conductive layer (for example, IZO, ZnO) can be used as the transparent conductive layer 181. In addition, a conductive layer 182 is arranged above the protective film 124. The conductive layer 182 can be formed of the same material as the source or drain electrode 117 and the source or drain electrode 118 and can be formed with a three-layer structure of, for example, molybdenum, aluminum and molybdenum. In addition, the conductive layer 182 is used for forming routing wirings in the periphery region 110 and capacitor elements additionally arranged in the pixel 109. Furthermore, by arranging the transparent conductive layer 181 above the source or drain electrode 118, it can be protected from etching when the conductive layer 182 is formed. In addition, an inorganic insulating layer 183 is arranged above the transparent conductive layer 181. A silicon nitride film or the like is preferably used as the inorganic insulating layer 183. A contact hole is formed in a region of the inorganic insulating layer 183 where the source or drain electrode 118 and the transparent conductive layer 181 overlap.

A pixel electrode 125 is arranged above the inorganic insulating layer 183. The pixel electrode 125 is electrically connected to the transparent conductive layer 181 through a contact hole arranged in the inorganic insulating layer 183. In the display device 100 of the present embodiment, the pixel electrode 125 functions as an anode forming the light emitting element 130. The pixel electrode 125 has a different structure according to whether it is a top emission type or a bottom emission type. For example, in the case of a top emission type, it is preferred to use a metal film having high reflectance as the pixel electrode 125 or to use a stacked layer structure of a metal film and a high transparent conductive layer having a high work function such as an indium oxide type transparent conductive layer (for example, ITO) or a zinc oxide type transparent conductive layer (for example, IZO, ZnO). On the other hand, in the case of the bottom emission type, the transparent conductive layer described above is used as the pixel electrode 125. In the present embodiment, a top emission type organic EL display device is explained as an example. In addition, it is possible to form an additional capacitor by the conductive layer 182, the inorganic insulating layer 183 and the pixel electrode 125. In the present embodiment, although a structure in which the transparent conductive layer 181 is arranged is explained, one embodiment of the present invention is not limited thereto. It is possible to directly the source electrode or the drain electrode 118 and the pixel electrode 125 in the contact hole arranged in the planarization film 123 without arranging the transparent conductive layer 181. In addition, the conductive layer 182 and the inorganic insulating layer 183 may be omitted.

A first insulating layer 126 formed from an organic resin material is arranged above the pixel electrode 125. A known resin material such as polyimide, polyamide, acrylic, epoxy or siloxane can be used as the organic resin material. The first insulating layer 126 has an opening in a part above the pixel electrode 125. The first insulating layer 126 is arranged to cover an end part (edge part) of the pixel electrode 125 between adjacent pixel electrodes 125, and functions as a member that separates adjacent pixel electrodes 125. As a result, the first insulating layer 126 is also generally called a "partition wall" or a "bank". A part of the pixel electrode 125 exposed from the first insulating layer 126 is a light emitting region of the light emitting element 130. It is preferred that an inner wall of the opening part of the first insulating layer 126 has a tapered shape. In this way, it possible to reduce coverage defects at an end part of the pixel electrode 125 at the time of forming a light emitting layer described herein. The first insulating layer 126 may not only cover the end part of the pixel electrode 125 but may also function as a filling material filling a concave part caused by a contact hole of the planarization film 123 and the protective film 124. In addition, the planarization film 123 has a region in contact with the first insulating layer 126 through an opening formed in the protective film 124 and the inorganic insulating layer 183. This is an opening part for releasing moisture or degassing from the planarization film 123 through the first insulating layer 126 using a thermal treatment of the first insulating layer 126. Furthermore, in the case where a silicon oxide film is used for the protective film 124, the opening part may be omitted.

An organic layer is arranged above the pixel electrode 125. The organic layer has at least a light emitting layer 127 formed from an organic material and functions as a light emitting part of a light emitting element 130. In addition to the light emitting layer 127, the organic layer may also include various charge transport layers such as a hole injection layer and/or a hole transport layer 184, an electron injection layer and/or an electron transport layer 185. The light emitting layer 127 is arranged to cover the light emitting region, that is, to cover an opening part of the first insulating layer 126 in the light emitting region.

Furthermore, in the present embodiment, an organic layer including a light emitting layer 127 which emits light of a desired color is arranged and an organic layer including different light emitting layers 127 is formed over each pixel electrode 125, whereby each color of RGB is displayed. That is, in this embodiment, the light emitting layer 127 of the organic layer is discontinuous between adjacent pixel electrodes 125. In addition, a hole injection layer and/or hole transport layer 184, electron injection layer and/or electron transport layer 185 are continuous between adjacent pixel electrodes 125. A known structure or a known material can be used as the organic layer and is not particularly limited to the structure of the present embodiment. In addition, the organic layer may have a light emitting layer 127 that emits white light, and each color of RGB may be displayed through a color filter. In this case, the organic layer may also be arranged above the first insulating layer 126.

A counter electrode 128 is arranged above the organic layer and the first insulating layer 126. The counter electrode 128 functions as a cathode which forms a light emitting element 130. Since the display device 100 of the present embodiment is a top emission type, a transparent electrode is used as the counter electrode 128. An MgAg thin film or a transparent conductive layer (ITO or IZO) is used as the thin film forming the transparent electrode. The counter electrode 128 is also arranged above the first insulating layer 126 above each pixel 109. The counter electrode 128 is electrically connected to an external terminal via a lower layer conductive layer in the periphery region near an end part of the display region 103. As described above, in the present embodiment, the light emitting element 130 is formed by a part of the pixel electrode 125 (anode) exposed from the first insulating layer 126, an organic layer (light emitting part) and the counter electrode 128 (cathode).

As shown in FIG. 2, the first inorganic insulating layer 131, the organic insulating layer 132 and the second inorganic insulating layer 133 are arranged above the display region 103. The first inorganic insulating layer 131, the organic insulating layer 132 and the second inorganic insulating layer 133 function as a sealing film for preventing moisture and oxygen from entering the light emitting element 130. By providing the sealing film above the display region 103, moisture and oxygen can be prevented from entering the light emitting element 130, and it is possible to improve the reliability of the display device. It is possible to use a film of silicon nitride ($SixNy$), silicon oxynitride ($SiOxNy$), silicon nitride oxide ($SiNxOy$), aluminum oxide ($AlxOy$), aluminum nitride ($AlxNy$), aluminum oxynitride ($AlxOyNz$), aluminum nitride oxide ($AlxNyOz$), or the like can be used as the first inorganic insulating layer 131 and the second inorganic insulating layer 133 (x, y, z are arbitrary). A polyimide resin, an acrylic resin, an epoxy resin, a silicone resin, a fluororesin, a siloxane resin, or the like can be used as the organic insulating layer 132.

From the second substrate 112 explained above to the sealing film are collectively referred to as an array substrate in the present embodiment.

An adhesive material 135 is arranged above the second inorganic insulating layer 133. For example, an acrylic type, rubber type, silicone type, urethane type adhesive material can be used as the adhesive material 135. In addition, the adhesive material 135 may include moisture absorbing substances such as calcium and zeolite. By including a moisture absorbing substance in the adhesive material 135, even when moisture enters into the display device 100, it is possible to delay the arrival of moisture to the light emitting element 130. In addition, a spacer may be arranged above the adhesive material 135 in order to secure a gap between the first substrate 101 and the counter substrate 102. Such a spacer may be mixed with the adhesive material 135 or may be formed of a resin or the like above the first substrate 101.

For example, an overcoat layer may be arranged for the counter substrate 102 for flattening. In the case when the organic layer emits white light, a color filter corresponding to each color of RGB and a black matrix arranged between the color filters are formed on a main surface (surface facing the first substrate 101) of the counter substrate 102. In the case when a color filter is not formed on the counter substrate 102 side, for example, a color filter may be directly formed on the sealing film and the adhesive 135 can be formed thereon. A polarization plate 138 is arranged on the rear side surface (display surface side) of the counter substrate 102.

<First Structure of Terminal Part>

Next, the structure of the terminal part 151 arranged in the periphery region 110 of the display device 100 is explained while referring to FIG. 3 to FIG. 8.

Figure 3:
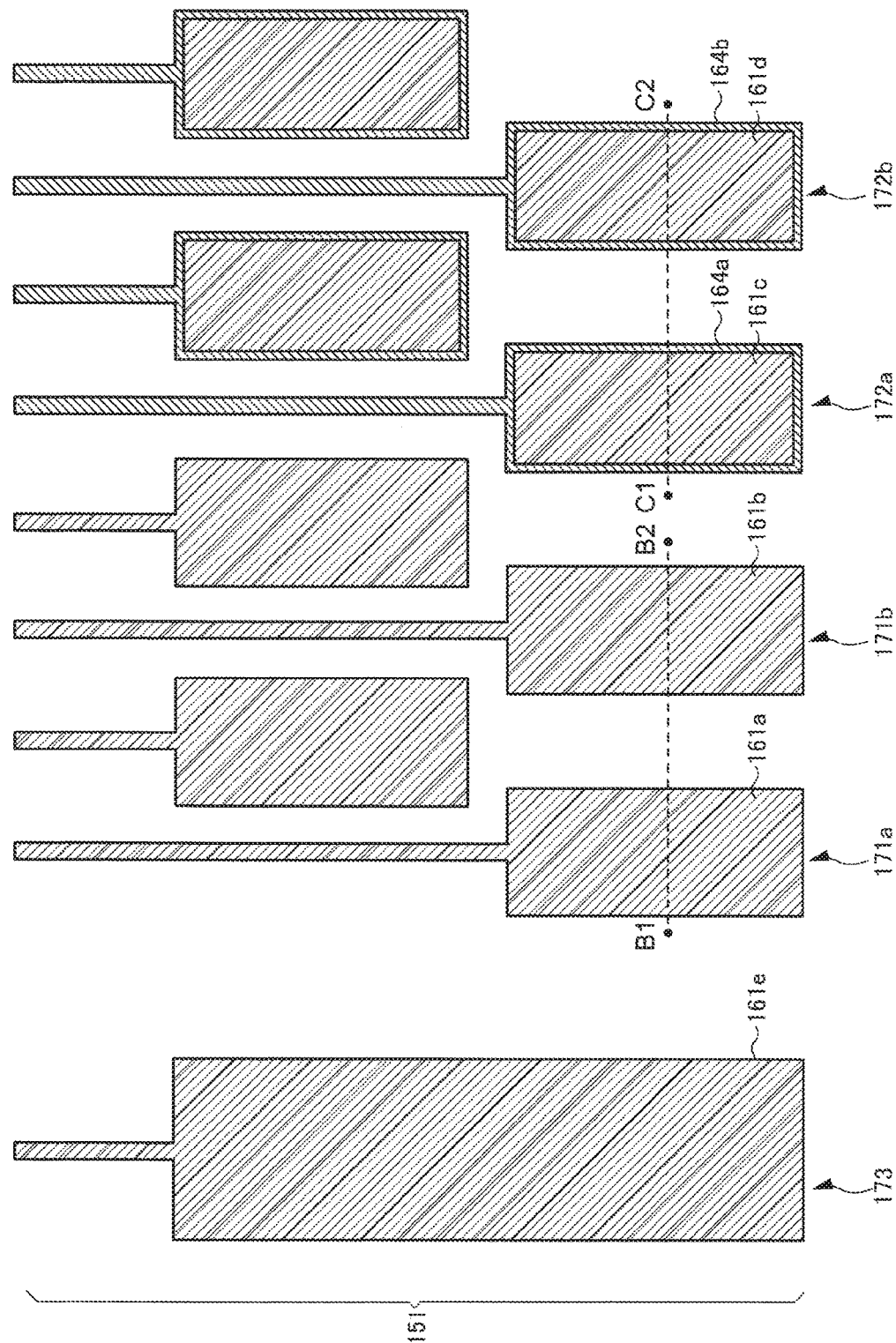
FIG. 3 is a planar view diagram showing a structure of a display device related to one embodiment of the present invention.

FIG. 3 shows an enlarged planar view a part of the terminal part 151 arranged above the first substrate 101. In FIG. 3, first terminals 171a and 171b, second terminals 172a and 172b, and third terminal 173 are shown. FIG. 3 shows an example in which a plurality of first terminals and a plurality of second terminals included in the terminal part 151 are arranged in a zigzag manner. The zigzag arrangement refers to an arrangement in which a plurality of terminals are arranged on upper and lower two rows at the same pitch and the upper row and the lower row are shifted relatively by a half pitch. Furthermore, in FIG. 3, the first terminals 171a and 171b, the second terminals 172a and 172b and the third terminal 173 show only a conductive layer, and an illustration of an insulating layer is omitted. In addition, an illustration of the structure of the COF 108 connected to the terminal part 151 is omitted.

The first terminal 171a includes a conductive layer 161a, and the first terminal 171b includes a conductive layer 161b. The second terminal 172a includes a conductive layer 161c and a conductive layer 164a, and the second terminal 172b includes a conductive layer 161d and a conductive layer 164b. The third terminal 173 includes a conductive layer 161e.

For example, the first terminals 171a and 171b are electrically connected to wiring which controls the scanning line drive circuit 104. In addition, the second terminals 172a and 172b are electrically connected to the data line drive circuit 105. In the case when the data line drive circuit 105 is incorporated in the driver IC, it is electrically connected to the signal line of the display region 103. In addition, the third terminal 173 is electrically connected to a current supply line, for example.

Figure 4:
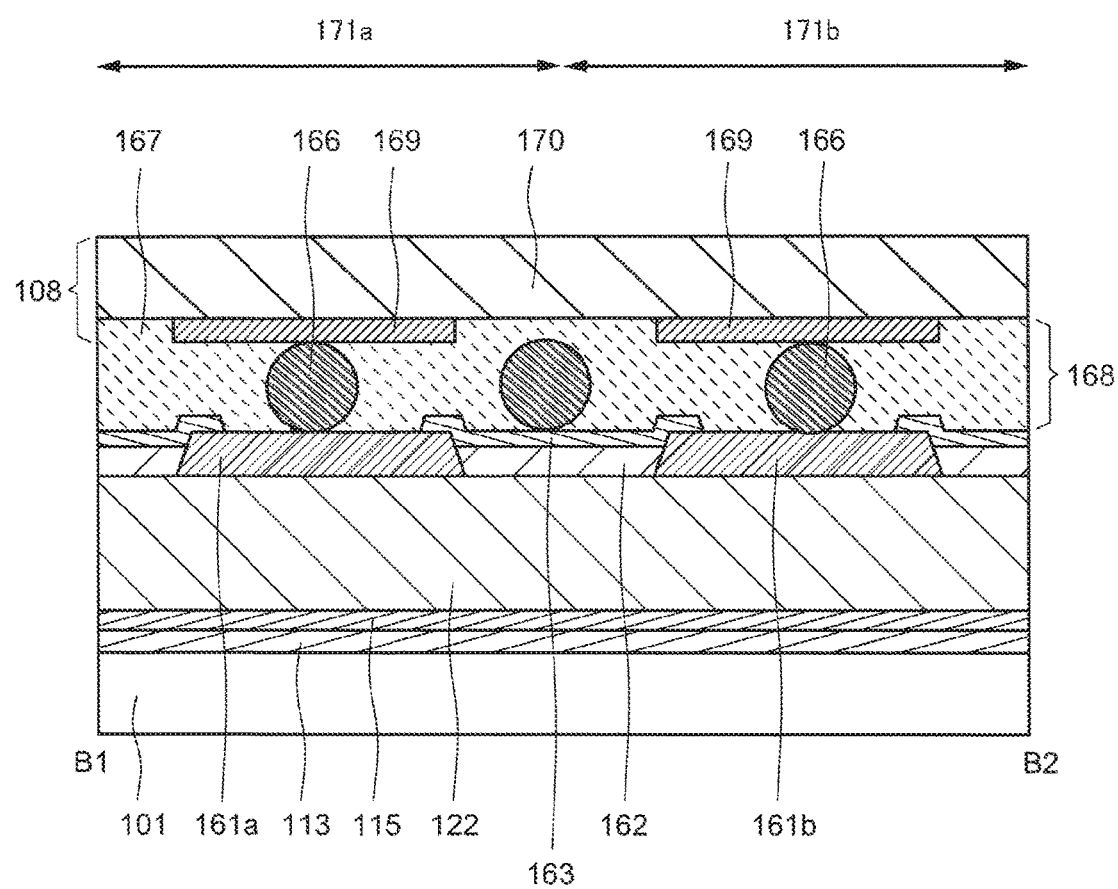
FIG. 4 is a cross-sectional view along the line B1-B2 in FIG. 3.

FIG. 4 is a cross-sectional view along the broken line B1-B2 shown in FIG. 3. The cross-sectional view shown in FIG. 4 is a cross-sectional view of the first terminals 171a and 171b. FIG. 4 also shows an anisotropic conductive film 168 and a COF 108 arranged above the first terminals 171a and 171b.

As shown in FIG. 4, an underlying film 113 is arranged above the first substrate 101, and a gate insulating film 115 is arranged above the underlying film 113. In addition, an interlayer insulating layer 122 is arranged above the gate insulating film 115.

Conductive layers 161a and 161b are arranged above the interlayer insulating layer 122. The conductive layers 161a and 161b are formed from the same material as the source or drain electrodes 117 and 118 included in the transistor 120 arranged in the display region 103.

In addition, a planarization film 162 is arranged above the interlayer insulating layer 122. The upper surface of the planarization film 162 is lower than the upper surfaces of the conductive layers 161a and 161b. The planarization film 162 is formed from the same material as the planarization film 123 arranged in the display region 103. Here, the film thickness of the planarization film 162 arranged the terminal part 151 is thinner than the film thickness of the planarization film 123 arranged in the display region 103.

In addition, an inorganic insulating layer 163 is arranged above the planarization film 162. The inorganic insulating layer 163 is arranged to cover the end parts of the conductive layers 161a and 161b. The inorganic insulating layer 163 has higher adhesion to the conductive layers 161a and 161b than the planarization film 162. As a result, it is possible to prevent the inorganic insulating layer 163 from peeling from the end parts of the conductive layers 161a and 161b.

The conductive layers 161a and 161b are electrically connected to a terminal 169 of the COF 108 via the anisotropic conductive film 168. The anisotropic conductive film 168 includes conductive particles 166 and a thermosetting resin 167. In the COF 108, the terminal 169 is arranged above a base film 170. It is preferred that the conductive particles 166 have a high hardness in order to reduce contact resistance with the conductive layers 161a and 161b.

In the structure of a conventional terminal part, in the case when the organic insulating film is arranged above wiring forming the terminal part, since the adhesion between the wiring and the organic insulating film is low, the organic insulating film may be peeled off. By peeling off the organic insulating film, peeling occurs between the terminal and the FPC which causes conduction defects with the FPC and there is a possibility that the reliability of the display device deteriorates. In addition, in the case where conductive particles having high hardness are used, when the COF 108 is adhered, the conductive particles are embedded in an organic planarization film and thereby the conductive particles hardly disperse, and there is a possibility that elongation of a thermosetting resin 167 varies.

Therefore, in the present embodiment, in the first terminal part 171a and 171b, the upper surface of the planarization film 162 is lower than the upper surface of the conductive film 161a and 161. In addition, in the first terminal part 171a and 171b, the inorganic insulating layer 163 is arranged to cover end parts of the conductive layers and 161a. Since the conductive layers 161a and 161b and the inorganic insulating layer 163 have high adhesion, peeling of the inorganic insulating layer 163 can be prevented. In this way, it is possible to obtain a display device with improved reliability.

In addition, when pressing the terminal part 151 and the COF 108 via the anisotropic conductive film 168, the pressure applied to the COF 108 can be made uniform above the conductive layers 161a and 161b and the inorganic insulating layer 163. As a result, it is possible to prevent deformation of the COF 108 and thereby it is possible to prevent separation between the conductive layers 161a, 161b and the anisotropic conductive film 168. In addition, when pressing the COF 108 to the terminal part 151, it is possible to make the elongation of the base film 170 of the COF 108 uniform. In this way, it is possible to obtain a good connection between the conductive layers 161a and 161b and the terminals 169 arranged above the COF 108. In addition, by placing a harder inorganic insulating layer 163 than the planarization film 162 on an uppermost surface, it is possible to suppress the conductive particle 166 from being embedded. In this way, the conductive particles can be dispersed easily in the terminal part, and the elongation of the thermosetting resin 167 can be made uniform.

Figure 5:
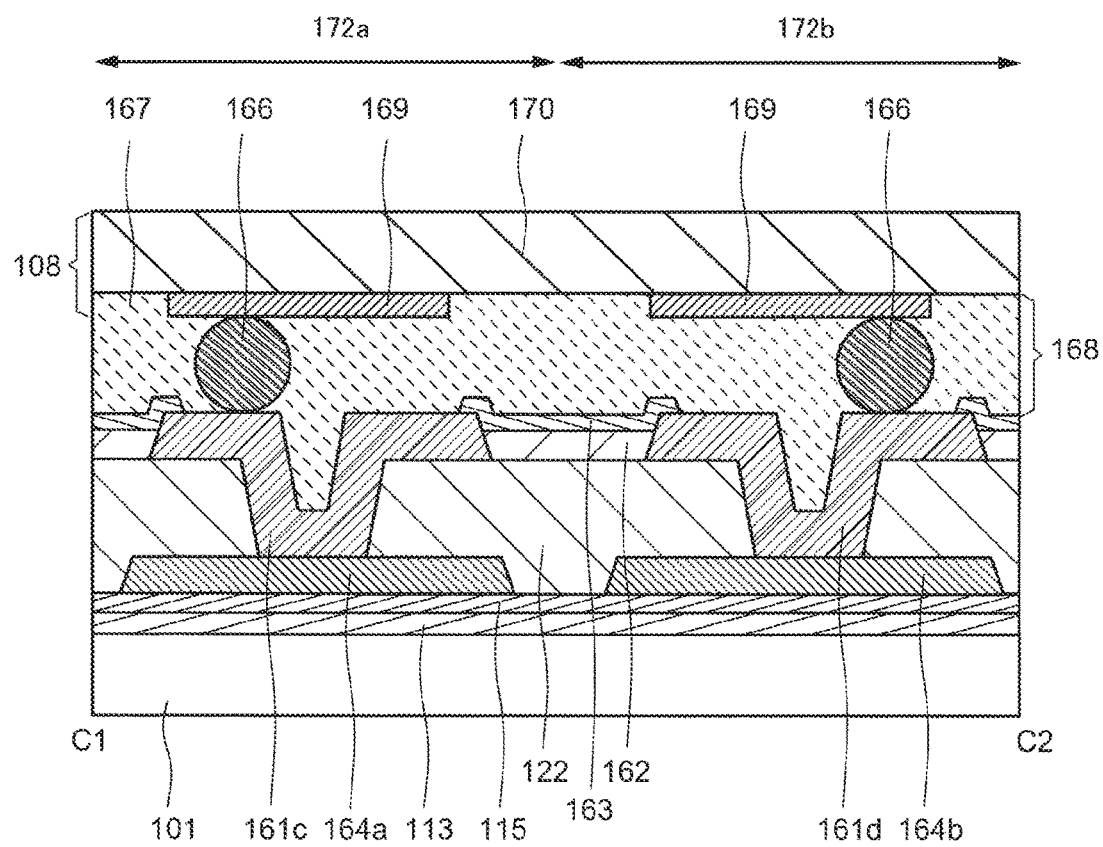
FIG. 5 is a cross-sectional view along the line C1-C2 in FIG. 3.

Next, FIG. 5 shows a cross-sectional view along the broken line C1-C2 shown in FIG. 3. The cross-sectional view shown in FIG. 5 is a cross-sectional view of the second terminals 172a and 172b. FIG. 5 also shows the anisotropic conductive film 168 and the COF 108 arranged above the second terminals 172a and 172b.

As shown in FIG. 5, an underlying film 113 is arranged above the first substrate 101, and a gate insulating film 115 is arranged above the underlying film 113. In addition, conductive layers 164a and 164b are arranged above the gate insulating film 115. An interlayer insulating layer 122 is arranged above the conductive layers 164a and 164b and an opening part is included in the conductive layers 164a and 164b. Conductive layers 161c and 161d are arranged above the conductive layers 164a and 164b via opening parts in the interlayer insulating layer 122. A planarization film 162 is arranged above the interlayer insulating layer 122. Furthermore, the conductive layers 164a and 164b are formed from the same material as the gate electrode 116 included in the transistor 120 arranged in the display region 103. The conductive layers 161a and 161b are formed from the same material as the source or drain electrodes 117 and 118 included in the transistor 120 arranged in the display region 103. The film thickness of the planarization film 162 arranged in the terminal part 151 is thinner than the film thickness of the planarization film 123 arranged in the display region 103.

In addition, an inorganic insulating layer 163 is arranged above the planarization film 162. The inorganic insulating layer 163 is arranged to cover the end pats of the conductive layers 161c and 161d. The inorganic insulating layer 163 can be prevented from peeling from the end parts of the conductive layers 161c and 161d compared with the planarization film 162.

The conductive layers 161a and 161b are electrically connected to the terminal 169 of the COF 108 via the anisotropic conductive film 168. The anisotropic conductive film 168 includes conductive particles 166 and a thermosetting resin 167. In the COF 108, a terminal 169 is arranged on a base film 170. It is preferred that the conductive particles 166 have a high hardness in order to reduce contact resistance with the conductive layers 161a and 161b.

Similar to the first terminals 171a and 171b, the upper surface of the planarization film 162 is arranged lower than the upper surfaces of the conductive layers 161a and 161b above the interlayer insulating layer 122. In addition, an inorganic insulating layer 163 is arranged above the planarization film 162. The inorganic insulating layer 163 covers the end parts of the conductive layers 161a and 161b.

Also in the structure of the second terminals 172a and 172b shown in FIG. 5, the upper surface of the planarization film 162 is arranged lower than the upper surfaces of the conductive layers 161c and 161d, and the inorganic insulating layer 163 is arranged to cover the end parts of the conductive layers 161c and 161d above the planarization film 162. Since the conductive layers 161c and 161d and the inorganic insulating layer 163 have high adhesion, it is possible to prevent peeling of the inorganic insulating layer 163. In this way, it is possible to obtain a display device with improved reliability.

In addition, when pressing the terminal part 151 and the COF 108 via the anisotropic conductive film 168, the pressure applied to the COF 108 can be uniformly applied above the conductive layers 161c and 161d and the inorganic insulating layer 163. In this way, since it is possible to prevent deformation of the COF 108, it is possible to prevent separation between the conductive layers 161c and 161d and the anisotropic conductive film 168. In addition, when pressing the COF 108 to the terminal part 151, it is possible to make the elongation of the base film 170 of the COF 108 uniform. In this way, it is possible to obtain a good connection between the conductive layers 161c, 161d and the terminals 169 arranged on the COF 108. In addition, by arranging a harder inorganic insulating layer 163 than the planarization film 162 on the uppermost surface, it is possible to suppress the conductive particles 166 from being embedded. In this way, the conductive particles can be dispersed easily in the terminal part and the elongation of the thermosetting resin 167 can be made uniform.

In FIG. 5, although a case is shown where the interlayer insulating layer 122 has only one opening part for connecting the conductive layer 161a and the conductive layer 164a, one embodiment of the present invention is not limited thereto. A plurality of opening parts of the interlayer insulating layer 122 may be arranged.

The structure of the third terminal 173 is the same as that of the first terminals 171a and 171b except that the sizes of the terminals are different. Therefore, a detailed explanation is omitted.

<Second Structure of Terminal Part>

Figure 6:
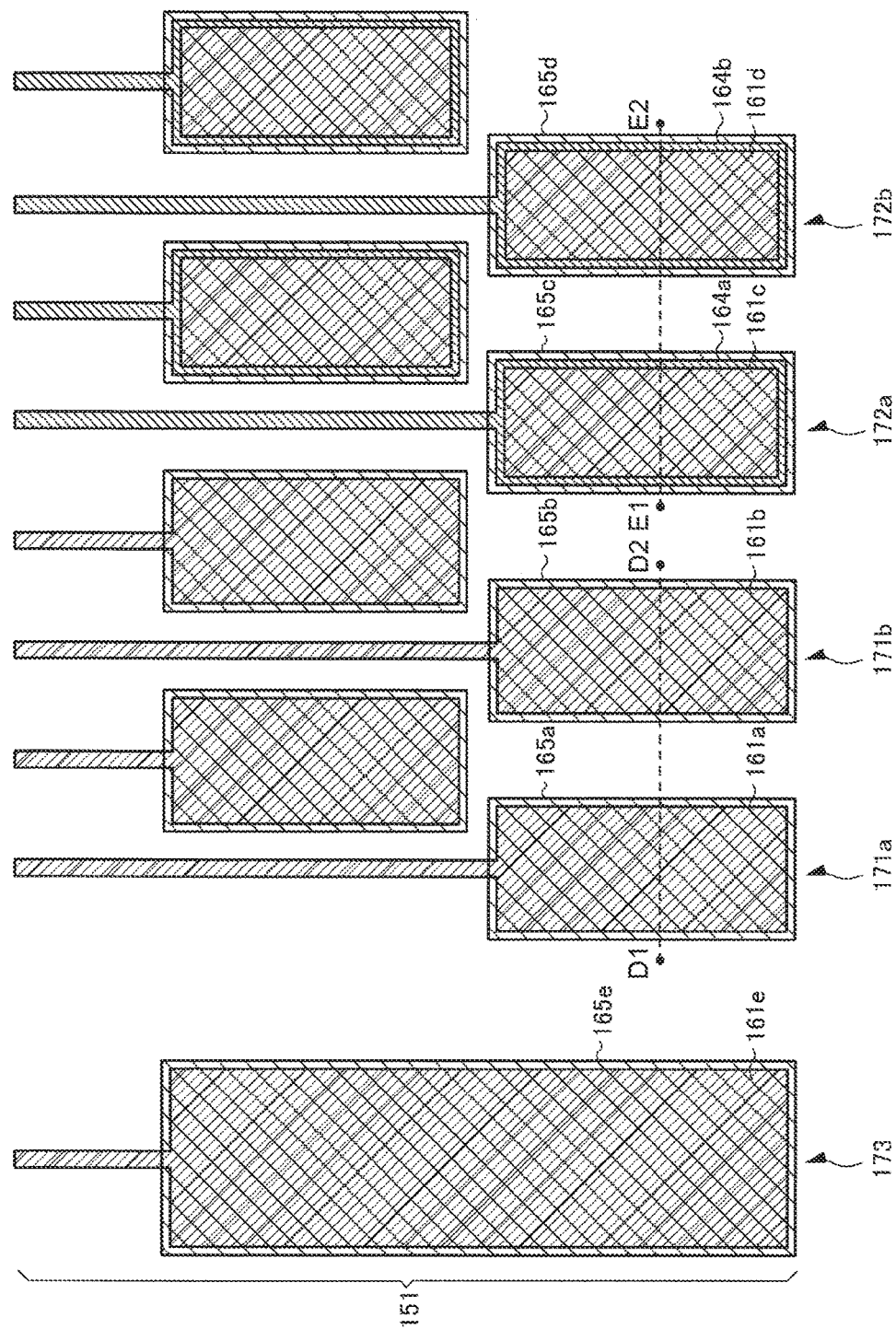
FIG. 6 is a planar view diagram showing a structure of a display device related to one embodiment of the present invention.
Figure 7:
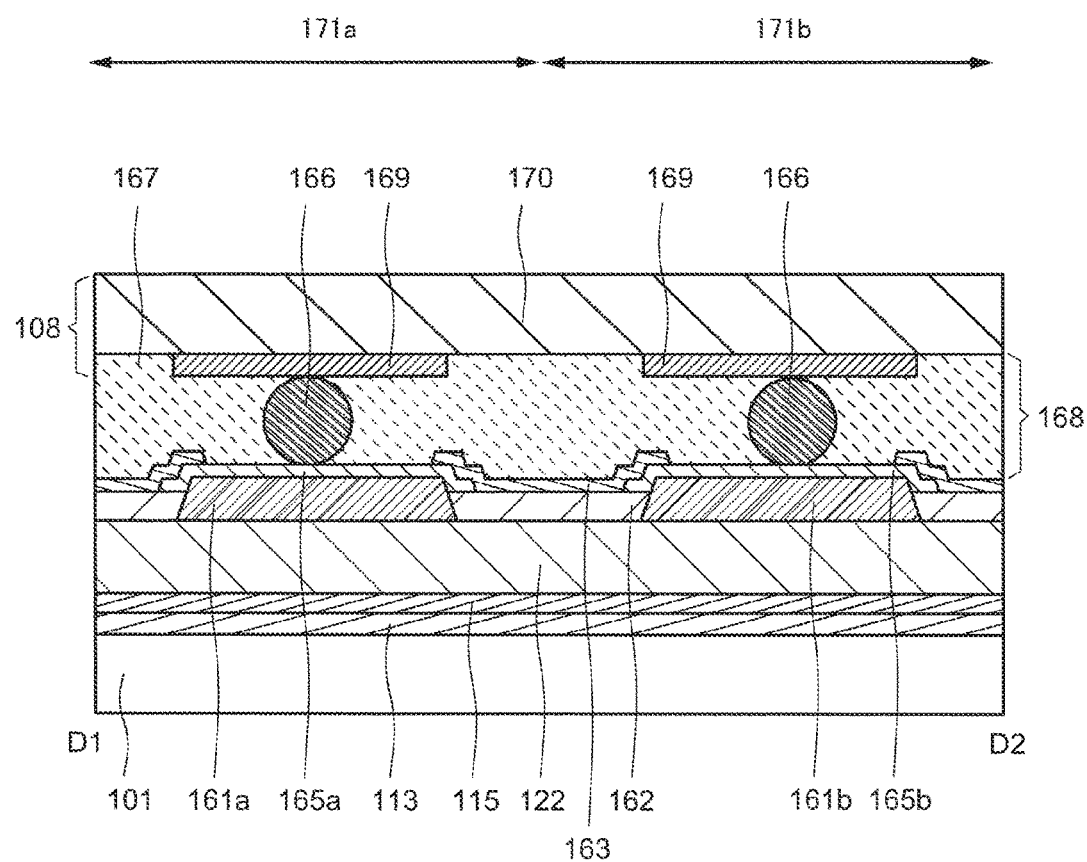
FIG. 7 is a cross-sectional view along the line D1-D2 in FIG. 6.
Figure 8:
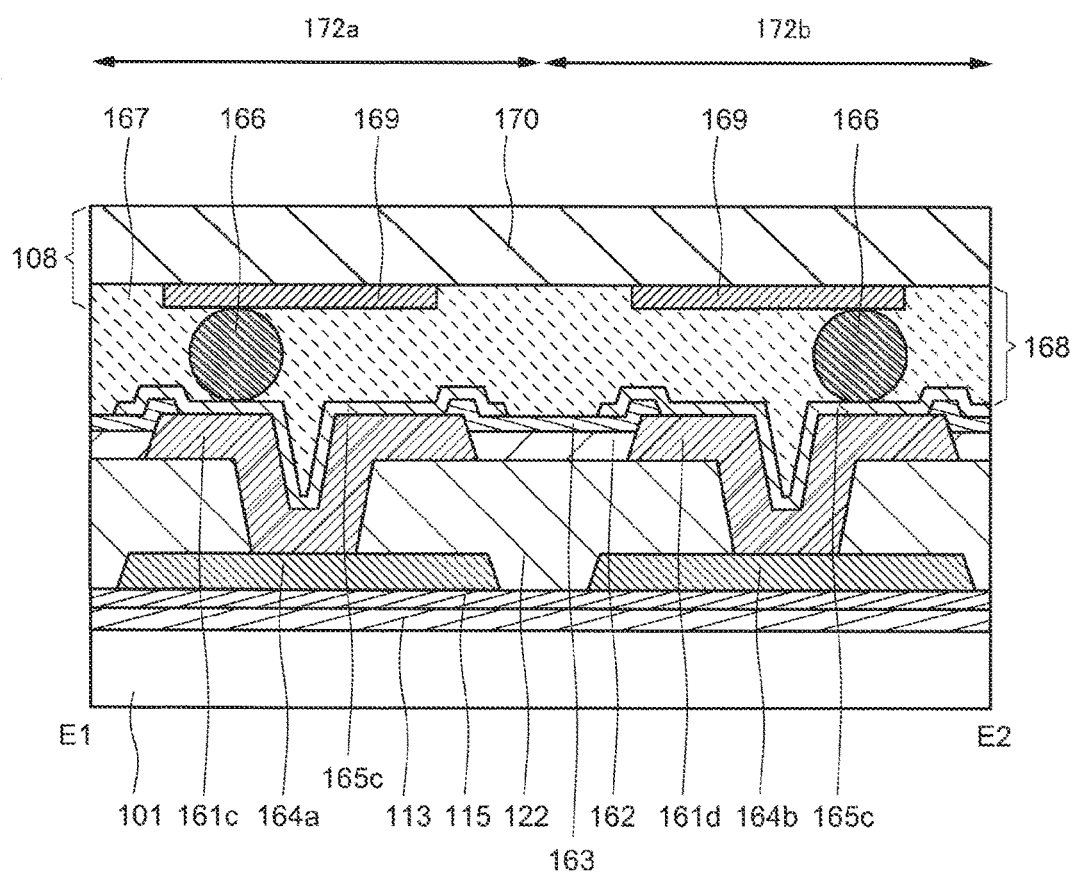
FIG. 8 is a cross-sectional view along the line E1-E2 in FIG. 6.

Next, a structure of the terminal part which is partly different from the structure of the terminal part 151 explained in the first structure of the terminal part is explained while referring to FIG. 6 to FIG. 8.

FIG. 6 is an enlarged planar view showing a part of the terminal part 151 arranged above the first substrate 101. In FIG. 6, the first terminals 171a and 171b, the second terminals 172a and 172b, and the third terminal 173 are shown. FIG. 6 shows an example in which a plurality of first terminals and a plurality of second terminals included in the terminal part 151 are arranged in a zigzag manner. In FIG. 6, the first terminals 171a and 171b, the second terminals 172a and 172b, and the third terminal 173 show only a conductive layer, and exemplification of an insulating layer is omitted. In addition, the structure of the COF 108 connected to the terminal part 151 is omitted.

In the terminal part 151 shown in FIG. 6, the first terminals 171a and 171b, the second terminals 172a and 172b, and the third terminal 173 each have transparent conductive layers 165a to 165e.

The first terminal 171a includes a conductive layer 161a and a transparent conductive layer 165a, and the first terminal 171b includes a conductive layer 161b and a transparent conductive layer 165b. In addition, the second terminal 172a includes a conductive layer 161c, a conductive layer 164a, and a transparent conductive layer 165c, and the second terminal 172b includes a conductive layer 161d, a conductive layer 164b and a transparent conductive layer 165d. Furthermore, the third terminal 173 includes a conductive layer 161e and a transparent conductive layer 165e.

For example, the first terminals 171a and 171b are electrically connected to wiring which controls the scanning line drive circuit 104. In addition, the second terminals 172a and 172b are electrically connected to the data line drive circuit 105, for example. In the case when the data line drive circuit 105 is incorporated in the driver IC, the second terminals 172a and 172b are electrically connected to signal lines of the display region 103. In addition, the third terminal 173 is electrically connected to a current supply line, for example.

FIG. 7 is a cross-sectional view along a broken line D1-D2 shown in FIG. 6. The cross-sectional view shown in FIG. 7 is a cross-sectional view of the first terminals 171a and 171b. FIG. 7 also shows the anisotropic conductive film 168 and the COF 108 arranged on the first terminals 171a and 171b.

As shown in FIG. 7, an underlying film 113 is arranged above a first substrate 101, and a gate insulating film 115 is arranged above the underlying film 113. In addition, an interlayer insulating layer 122 is arranged above the gate insulating film 115. Conductive layers 161a and 161b are arranged above the interlayer insulating layer 122. The conductive layers 161a and 161b are formed from the same material as the source or drain electrodes 117 and 118 included in the transistor 120 arranged in the display region 103. In addition, a planarization film 162 is arranged above the interlayer insulating layer 122. Here, the film thickness of the planarization film 162 arranged in the terminal part 151 is thinner than the film thickness of the planarization film 123 arranged in the display region 103.

A difference from the first terminals 171a and 171b shown in FIG. 4 is that the transparent conductive layers 165a and 165b are arranged above the conductive layers 161a and 161b respectively. By arranging the transparent conductive layers 165a and 165b, it is possible to prevent the upper surfaces of the conductive layers 161a and 161b from becoming oxidized. In addition, the transparent conductive layers 165a and 165b are formed from the same material as the transparent conductive layer 181 arranged in the display region 103. Furthermore, the transparent conductive layers 165a and 165b may be formed from the he same material as the pixel electrode 125 and the counter electrode 128.

In addition, an inorganic insulating layer 163 is arranged above the planarization film 162, and the inorganic insulating layer 163 covers the end parts of the transparent conductive layers 165a and 165b.

In the structure of the first terminals 171a and 171b shown in FIG. 7, the upper surface of the planarization film 162 is lower than the upper surfaces of the conductive layers 161a and 161b, and the upper surfaces of the transparent conductive layers 165a and 165b, and the inorganic insulating layer 163 is arranged above the planarization film 162 so as to cover the end parts of the transparent conductive layers 165a and 165b. Since the transparent conductive layers 165a and 165b and the inorganic insulating layer 163 have high adhesion, it is possible to prevent peeling of the inorganic insulating layer 163. In this way, it is possible to obtain a display device with improved reliability.

In addition, when pressing the terminal part 151 and the COF 108 via the anisotropic conductive film 168, the pressure applied to the COF 108 can be made uniform between the upper surface of the transparent conductive layers 165a and 165b and the upper surface of the inorganic insulating layer 163. In this way, since it is possible to prevent deformation of the COF 108, it is possible to prevent separation of the transparent conductive layers 165a and 165b from the anisotropic conductive film 168. In addition, when pressing the COF 108 to the terminal part 151, it is possible to make the elongation of the base film 170 of the COF 108 uniform. In this way, it is possible to obtain a good connection between the transparent conductive layers 165a and 165b and the terminals 169 arranged on the COF 108.

FIG. 8 is a cross-sectional view along a broken line E1-E2 shown in FIG. 6. The cross-sectional view shown in FIG. 8 is a cross-sectional view of the second terminals 172a and 172b. FIG. 8 also shows the anisotropic conductive film 168 and the COF 108 arranged on the second terminals 172a and 172b.

As shown in FIG. 8, an underlying film 113 is arranged above a first substrate 101, and a gate insulating film 115 is arranged above the underlying film 113. In addition, conductive layers 164a and 164b are arranged above the gate insulating film 115. An interlayer insulating layer 122 is arranged above the conductive layers 164a and 164b, and an opening part is arranged in the conductive layers 164a and 164b. Conductive layers 161a and 161b are arranged above the conductive layers 164a and 164b with an opening part of the interlayer insulating layer 122 interposed therebetween. A planarization film 162 is arranged above the interlayer insulating layer 122. The conductive layers 164a and 164b are formed from the same material as the gate electrode 116 included in the transistor 120 arranged in the display region 103. The conductive layers 161a and 161b are formed from the same material as the source or drain electrodes 117 and 118 included in the transistor 120 arranged in the display region 103. Here, the film thickness of the planarization film 162 arranged in the terminal part 151 is thinner than the film thickness of the planarization film 123 arranged in the display region 103.

A difference from the second terminals 172a and 172b shown in FIG. 5 is that the transparent conductive layers 165c and 165d are arranged above the conductive layers 161c and 161d respectively. By arranging the transparent conductive layers 165c and 165d, it is possible to prevent the upper surfaces of the conductive layers 161a and 161b from becoming oxidized. In addition, the transparent conductive layers 165a and 165b are formed from the same material as the pixel electrode 125 arranged in the display region 103.

In addition, an inorganic insulating layer 163 is arranged above the planarization film 162, and the inorganic insulating layer 163 covers the end parts of the transparent conductive layers 165a and 165b.

Also in the structure of the second terminals 172a and 172b shown in FIG. 8, the upper surface of the planarization film 162 is arranged lower than the upper surfaces of the conductive layers 161c and 161d, and the inorganic insulating layer 163 is arranged to cover the end parts of the conductive layers 165c and 165d above the planarization film 162. Since the conductive layers 165c and 165d and the inorganic insulating layer 163 have high adhesion, it is possible to prevent peeling of the inorganic insulating layer 163. In this way, it is possible to obtain a display device with improved reliability.

In addition, when pressing the terminal part 151 and the COF 108 via the anisotropic conductive film 168, the pressure applied to the COF 108 can be made uniform between the upper surface of the transparent conductive layers 165c and 165 and the upper surface of the inorganic insulating layer 163. In this way, since it is possible to prevent deformation of the COF 108, it is possible to prevent separation of the transparent conductive layers 165c and 165d from the anisotropic conductive film 168. In addition, when pressing the COF 108 to the terminal part 151, it is possible to make the elongation of the base film 170 of the COF 108 uniform. In this way, it is possible to obtain a good connection between the transparent conductive layers 165c and 165d and the terminals 169 arranged on the COF 108.

Furthermore, although an example was shown in the present embodiment in which the terminal part 151 has three types of first terminal 171a, 171b, second terminal 172a, 172b, and the third terminal 173, one embodiment of the present invention is not limited thereto.

The terminal part 151 may be formed of only one kind of the first terminals 171a and 171b or may be formed of only one type of the second terminals 172a and 172b.

Furthermore, although an example was shown in FIGS. 3 and 6 in which the plurality of first terminals 171a, 171b and the plurality of second terminals 172a, 172b of the terminal part 151 are arranged in a zigzag manner, one embodiment of the present invention is not limited thereto. For example, the plurality of first terminals 171a, 171b and the plurality of second terminals 172a, 172b may be arranged in a line along one side of the first substrate 101.

Furthermore, the structure of the third terminal 173 is the same as that of the first terminals 171a and 171b, except that the sizes of the terminals are different. Therefore, a detailed explanation is omitted.

<Method of Manufacturing Terminal Part>

Next, a method of manufacturing a display device according to one embodiment of the present invention is explained while referring to FIG. 9 to FIG. 12. FIG. 9 to FIG. 12 show a method of forming the first terminals 171a and 171b of the terminal part 151 shown in FIG. 7. Since the first terminals 171a and 171b of the terminal part 151 are formed at the same time as the pixels 109 of the display region 103, they are explained while referring to a part of the pixels 109.

Figure 9:
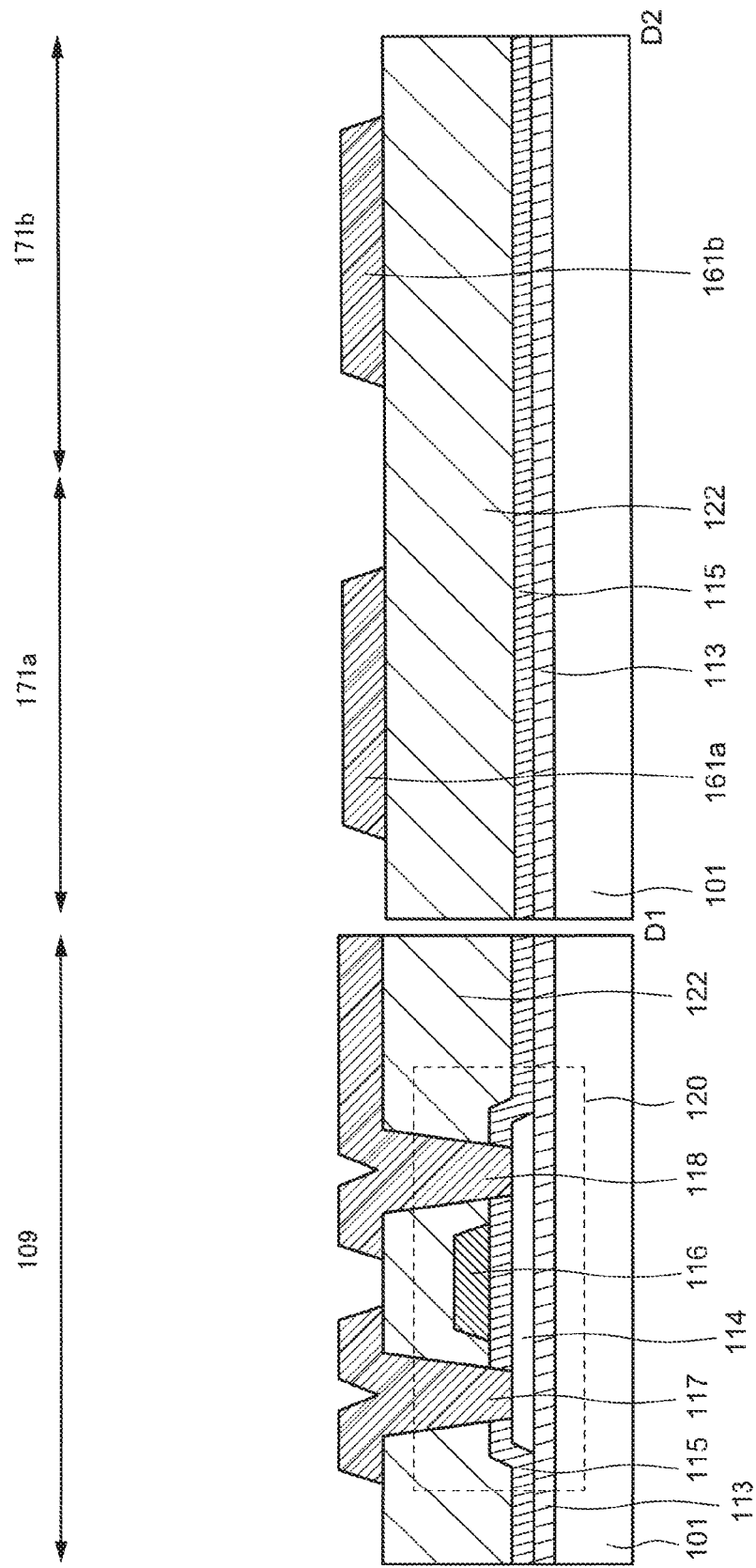
FIG. 9 is a cross-sectional view showing a manufacturing method of a display device related to one embodiment of the present invention.

First, as shown in FIG. 9, an underlying film 113 is formed above a first substrate 101. The underlying film 113 is formed using an inorganic material such as silicon oxide, silicon nitride, aluminum oxide or the like by a CVD method or a sputtering method. The underlying film 113 can be formed including a single layer structure or a stacked layer structure using the materials described above.

Next, a semiconductor layer 114 is formed above the underlying film 113 in the pixel 109. The semiconductor layer 114 can be formed using polysilicon, amorphous silicon, or an oxide semiconductor. Next, a gate insulating film 115 is formed in the pixel 109 and the first terminals 171a and 171b. The gate insulating film 115 is formed using silicon oxide or silicon nitride by a CVD method or a sputtering method. The gate insulating film 115 can be formed including a single layer structure or a stacked layer structure using the materials described above.

Next, the gate electrode 116 is formed above the semiconductor layer 114 with the gate insulating film 115 interposed therebetween in the pixel 109. The gate electrode 116 is formed from a metal material such as copper, molybdenum, tantalum, tungsten or aluminum.

Next, an interlayer insulating layer 122 is formed in the pixel 109 and the first terminals 171a and 171b. The gate insulating film 115 is formed in the interlayer insulating layer 122 using silicon oxide or silicon nitride by a CVD method or a sputtering method. Next, an opening part is formed in the interlayer insulating layer 122 in the pixel 109.

Next, a conductive film is formed above the interlayer insulating layer 122 in the pixel 109 and the first terminals 171a, 171b, and the conductive film is patterned. In this way, it is possible to form the source or drain electrodes 117 and 118 in the pixel 109, and the conductive layers 161a and 161b can be formed in the first terminals 171a and 171b.

Figure 10:
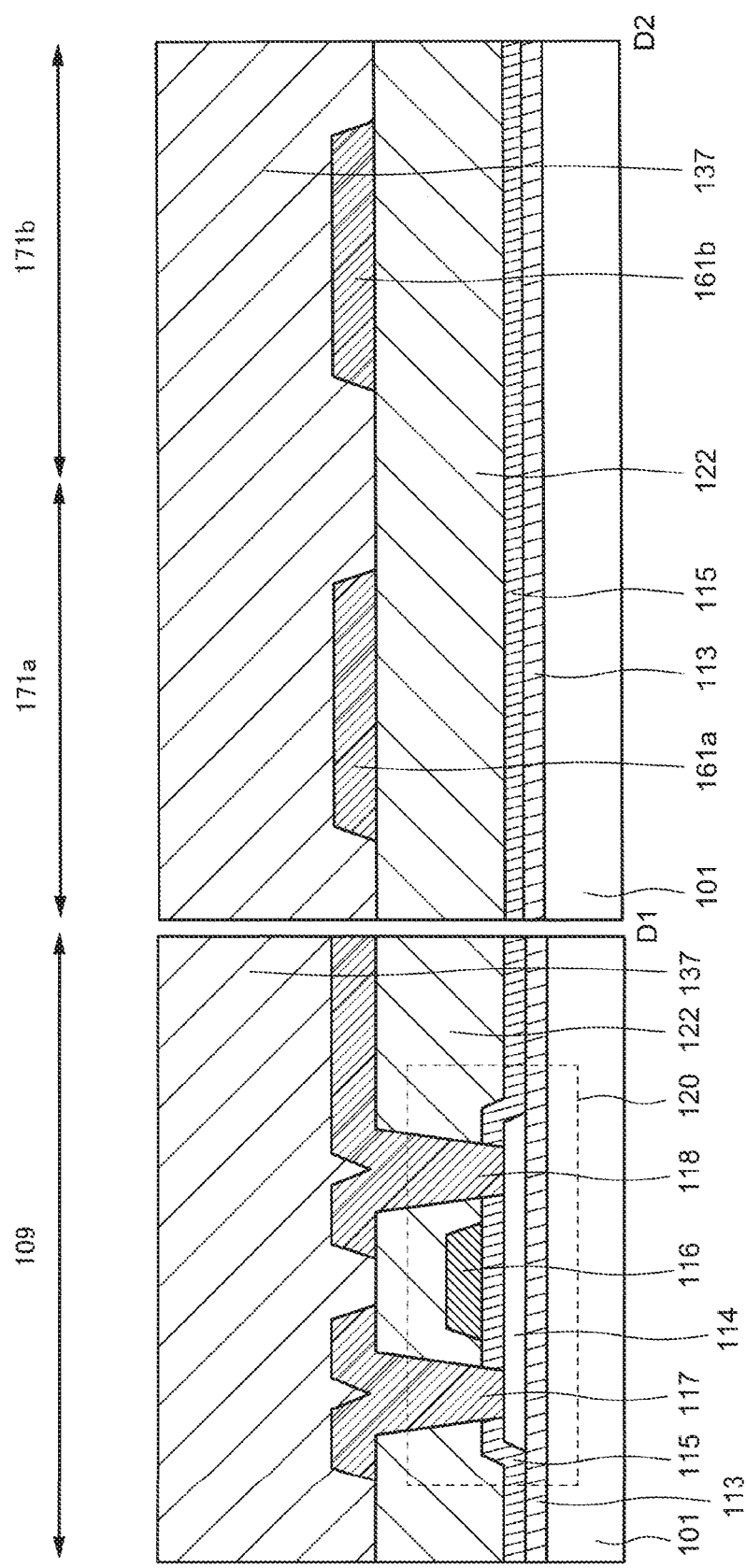
FIG. 10 is a cross-sectional view showing a manufacturing method of a display device related to one embodiment of the present invention.

Next, as shown in FIG. 10, a photosensitive organic resin 137 is coated on the interlayer insulating layer 122, the source or drain electrodes 117 and 118, and the conductive layers 161a and 161b. In the present embodiment, although a case is explained where a positive type photosensitive organic resin used, a negative type photosensitive organic resin may also be used.

Next, a halftone mask 175 is irradiated with exposure light to expose the photosensitive organic resin 137. The halftone mask is a mask having regions with different transmittance ratios. In the halftone mask 175 according to the present embodiment, the transmittance of a region corresponding to the first terminals 171a, 171b is higher than the transmittance of a region corresponding to the pixel 109. As a result, in the photosensitive organic resin 137, the region corresponding to the first terminals 171a and 171b is exposed more than the region corresponding to the pixel 109.

Figure 11:
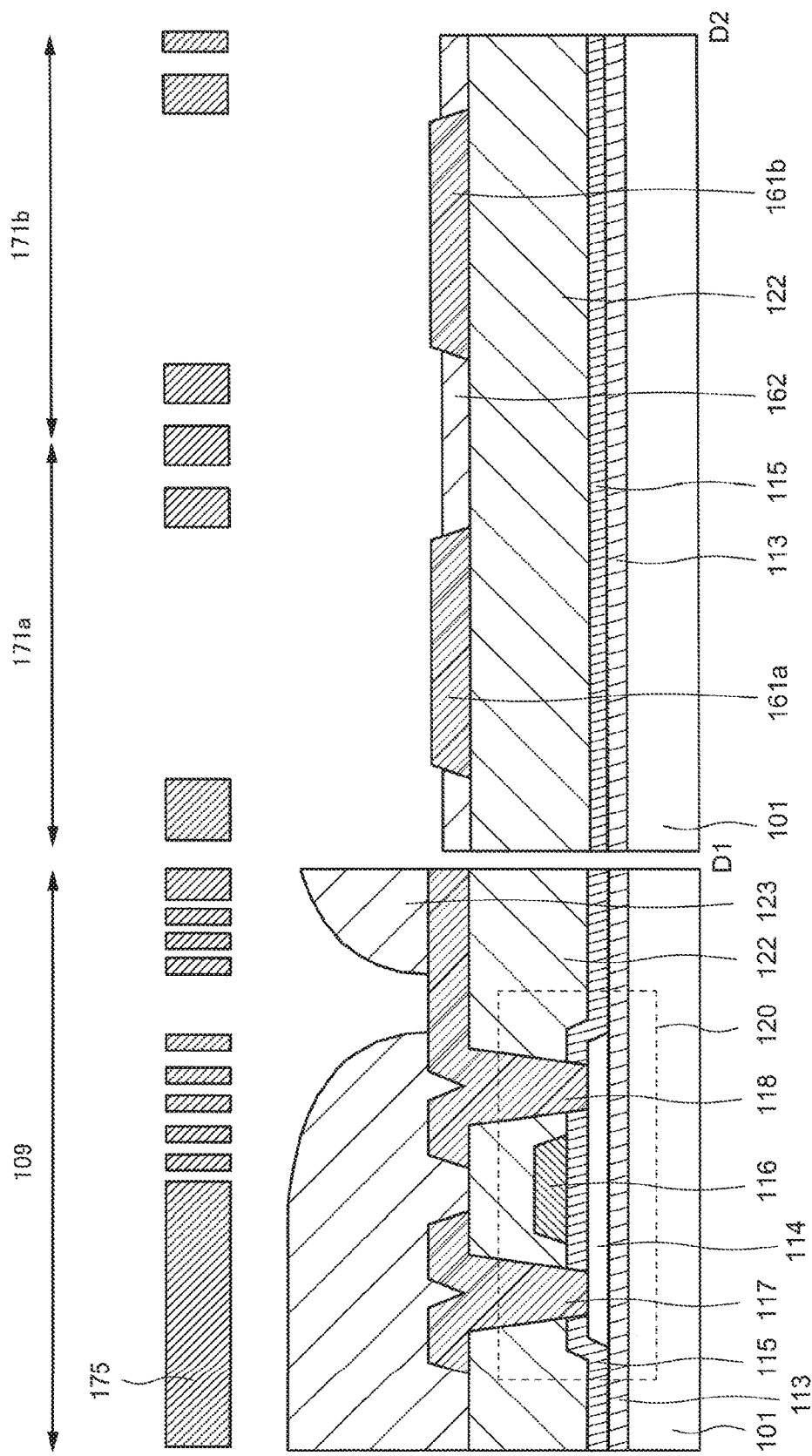
FIG. 11 is a cross-sectional view showing a manufacturing method of a display device related to one embodiment of the present invention.

Next, the exposed photosensitive organic resin 137 is etched. In the photosensitive organic resin 137, a region corresponding to the first terminals 171a and 171b which are significantly exposed has a larger film thickness which is removed by etching compared to a region corresponding to the pixel 109. In this way, as shown in FIG. 11, it is possible to form a planarization film having different film thickness between the pixel 109 and the first terminals 171a, 171b. In addition, the upper surfaces of the first terminals 171a and 171b can be arranged lower than the upper surfaces of the conductive layers 161a and 161b. By using the halftone mask 175 in this way, it is possible to simultaneously form a planarization film having different film thicknesses. Furthermore, after performing etching, ashing may be performed on the regions of the first terminals 171a and 171b.

Next, a transparent conductive film is formed above the pixel 109 and the first terminals 171a and 171b and patterning is performed. In this way, it is possible to form the transparent conductive layer 181 in the pixel 109. In addition, the transparent conductive layers 165a, 165b can be formed at the first terminals 171a, 171b. The transparent conductive layer 181 and the transparent conductive layers 165a and 165b can be formed in the same process. Furthermore, the transparent conductive layer 181 arranged in the pixel 109 can be omitted.

Next, an inorganic insulating layer is formed above the planarization film 162 in the pixel 109 and the first terminals 171a, 171b. Although not shown in the diagram, an inorganic insulating layer 183 is formed in the pixel 109. In addition, the inorganic insulating layer 163 is formed in the first terminals 171a, 171b. The inorganic insulating layer 183 and the inorganic insulating layer 163 can be formed in the same process. The inorganic insulating layer 163 is formed so as to cover the end parts of the conductive layers 161a and 161b. Furthermore, the inorganic insulating layer 183 arranged in the pixel 109 can be omitted.

Following this, a light emitting element is formed in the display region, and a sealing film is formed above the light emitting element. Next, a counter substrate is formed above the sealing film via an adhesive.

Lastly, the anisotropic conductive film 168 including the conductive particles 166 is coated and the COF 108 is pressure bonded, whereby the first terminals 171a and 171b of the terminal part 151 shown in FIG. 7 can be formed.

As described above, it is possible to manufacture the display device according to one embodiment of the present invention. By using the halftone mask 175, the film thickness of the planarization film of the periphery region 110 can be made thinner than the film thickness of the planarization film of the display region 103 without increasing the number of processes. In addition, in the periphery region 110, the upper surface of the planarization film above the interlayer insulating layer 122 can be made lower than the upper surfaces of the conductive layers 164a and 164b.

Figure 12:
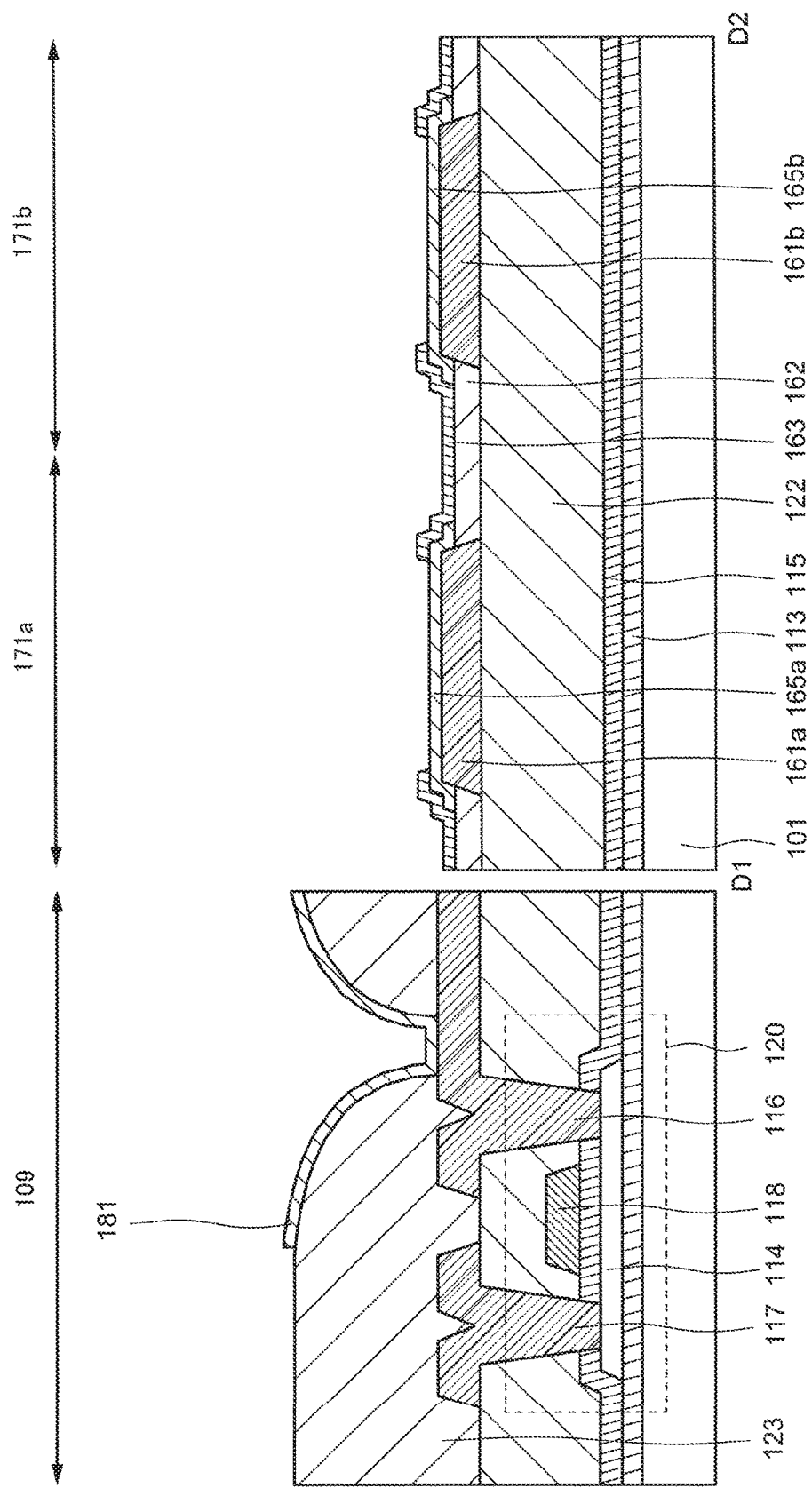
FIG. 12 is a cross-sectional view showing a manufacturing method of a display device related to one embodiment of the present invention.

Furthermore, in the case where the first terminals 171a and 171b shown in FIG. 4 are formed, a process of forming the transparent conductive layers 165a and 165b may be omitted in the process shown in FIG. 12.

In addition, in the case where the second terminals 172a and 172b shown in FIG. 5 and FIG. 8 are formed, the conductive layers 164a and 164b are formed above the gate insulating film 115 in the process shown in FIG. 9. Next, after an interlayer insulating layer 122 is formed above the conductive layers 164a and 164b, an opening part is formed in the interlayer insulating layer 122. Next, by forming the conductive layers 161a and 161b above the interlayer insulating layer 122, it is possible to connect the conductive layers 164a and 164b and the conductive layers 161a and 161b via the opening part of the interlayer insulating layer 122. The processes after forming the planarization film 162 are similar to the processes shown in FIG. 10 to FIG. 12. Furthermore, in the case where the second terminals 172a and 172b shown in FIG. 5 are formed, the process of forming the transparent conductive layers 165a and 165b may be omitted in the process shown in FIG. 12.

Based on the display device of each embodiment, the appropriate addition, deletion, or design change of elements or the addition, deletion, or condition change of a process by a person ordinarily skilled in the art is included in the scope of the present invention as long as they possess the concept of the present invention. In addition, each embodiment described above can be mutually combined within a scope that does not produce a technical contradiction.

In addition, even if other actions and effects different from the actions and effects brought about by each embodiment described above are obvious from the description of this specification, or those which can be easily predicted by a person skilled in the art, it is to be understood that such actions and effects are obviously provided by the present invention.

What is claimed is:

1. A display device comprising:
   a display region above a first substrate, wherein the display region includes:
   a plurality of a pixels;
   a transistor arranged to each of the plurality of the pixels;
   a light emitting element arranged to each of plurality of the pixels;
   an interlayer insulating layer above the transistor; and
   a planarization film made of an organic insulation material above the inter layer insulating layer, and
   a terminal region above the first substrate in a periphery region, wherein the terminal region includes:
   a plurality of terminals, each of which is made of a first conductive layer, above the interlayer insulating layer;
   the planarization film arranged in a side part of the first conductive layer;
   an inorganic insulating layer covering an upper surface of the planarization film and an upper surface of an end part of the first conductive layer;
   a first conductive particle directly above one of the plurality of terminals, wherein the bottom portion of the first conductive particle is in contact with the one of the plurality of terminals;
   a second conductive particle directly above the inorganic insulating layer and the planarization film, wherein the bottom portion of the second conductive particle is in contact with the inorganic insulating layer;
   a terminal electrode provided directly above the first conductive particle, wherein a bottom portion of the terminal electrode is in contact with the first conductive particle; and
   a thermosetting resin arranged between the one of the plurality of terminals and the first conductive particle, between the one of the plurality of terminals and the second conductive particle, between the one of the plurality of terminals and the terminal electrode, and between the first conductive particle and the second conductive particle,
   wherein the thermosetting resin is in contact with a whole upper surface of the second conductive particle,
   wherein
   a part of an upper surface of the first conductive layer is exposed from the inorganic insulating layer, and
   the upper surface of the planarization film is lower than the upper surface of the first conductive layer.

2. The display device according to claim 1, wherein a film thickness of the planarization film arranged in the terminal region is thinner than a film thickness of the planarization film arranged in the display region.

3. The display device according to claim 1, wherein the plurality of terminals is arranged in a zig zag manner along one side of the first substrate.

4. The display device according to claim 1, further comprising a source electrode or a drain electrode above the interlayer insulating layer,
   wherein
   the interlayer insulating layer including an opening, the opening is arranged above the transistor,
   the source electrode or the drain electrode is connected with the transistor via the opening, and
   the first conductive layer includes the same material as the source electrode or the drain electrode.

5. A display device, comprising:
   a display region above a first substrate, wherein the display region includes:
   a plurality of a pixels;
   a transistor arranged to each of the plurality of the pixels;
   a light emitting element arranged to each of the plurality of the pixels;
   an interlayer insulating layer above the transistor; and
   a planarization film made of an organic insulation material above the interlayer insulating layer, and
   a terminal region above the first substrate in a periphery region, wherein the terminal region includes:
   a plurality of terminals, each of which includes a first conductive layer and a second conductive layer, above the first substrate, wherein the second conductive layer is provided above the interlayer insulating layer and the first conductive layer,
   the planarization film arranged in a side part of the second conductive layer;
   an inorganic insulating layer above the planarization film;
   a first conductive particle directly above one of the plurality of terminals, wherein a bottom portion of the first conductive particle is in contact with the one of the plurality of terminals;
   a second conductive particle directly above the inorganic insulating layer and the planarization film, wherein a bottom portion of the second conductive particle is in contact with the inorganic insulating layer;
   a terminal electrode directly above the first conductive particle, wherein a bottom portion of the terminal electrode is in contact with the first conductive particle; and
   a thermosetting resin arranged between the one of the plurality of terminals and the first conductive particle, between the one of the plurality of the terminals and the second conductive particle, between the one of the plurality of the terminals and the terminal electrode, and between the first conductive particle and the second conductive particle, wherein the thermosetting resin is in contact with a whole upper surface of the second conductive particle,
   wherein
   the first conductive layer is connected with the second conductive layer via a first opening part of the interlayer insulating layer;

the inorganic insulating layer covers an upper surface of the planarization film and an upper surface of an end part of the second conductive layer;
a part of an upper surface of the second conductive layer is exposed from the inorganic insulating layer; and
the upper surface of the planarization film is lower than the upper surface of the second conductive layer.

6. The display device according to claim 5, wherein a film thickness of the planarization film arranged in the terminal region is thinner than a film thickness of the planarization film arranged in the display region.

7. The display device according to claim 5, wherein the plurality of terminals is arranged in a zig zag manner along one side of the first substrate.

8. The display device according to claim 5, wherein the transistor includes a semiconductor layer, a gate insulating film arranged above the semiconductor layer, and a gate electrode arranged above the gate insulating film, the interlayer insulating layer including a second opening part is arranged above the transistor, a source electrode or a drain electrode connected with the transistor via the second opening part is arranged above the interlayer insulating layer, the first conductive layer includes the same material as the gate electrode, and the second conductive layer includes the same material as the source electrode or the drain electrode.

9. A display device, comprising:
a display region above a first substrate, wherein the display region includes:
a plurality of a pixels;
a transistor arranged to each of the plurality of the pixels;
a light emitting element arranged to each of the plurality of the pixels;
an interlayer insulating layer above the transistor; and
a planarization film made of an organic insulation material above the interlayer insulating layer, and
a terminal region above the first substrate in a periphery region, wherein the terminal region includes:
a plurality of terminals, each of which includes a first conductive layer and a transparent conductive layer, above the interlayer insulating layer, wherein the transparent conductive layer is provided directly above the first conductive layer;
the planarization film arranged in a side part of the first conductive layer;
an inorganic insulating layer covering an upper surface of the planarization film, an upper surface of an end part of the transparent conductive layer, and an end part of the first conductive layer;
a first conductive particle being directly above one of the plurality of terminals, wherein a bottom portion of the first conductive particle is in contact with the one of the plurality of terminals;
a second conductive particle directly above the inorganic insulating layer and the planarization film, wherein a bottom portion of the second conductive particle is in contact with the one of inorganic insulating layer;
a terminal electrode directly above the first conductive particle, wherein a bottom portion of the terminal electrode is in contact with the first conductive particle; and
a thermosetting resin arranged between the one of the plurality of terminals and the first conductive particle, between the one of the plurality of terminals and the second conductive particle, between the one of the plurality of terminals and the terminal electrode, and between the first conductive particle and the second conductive particle, wherein the thermosetting resin is in contact with a whole upper surface of the second conductive particle,
wherein
the planarization film covers a side portion of the first conductive layer,
a part of an upper surface of the first conductive layer is exposed from the inorganic insulating layer, and
the upper surface of the planarization film is lower than the upper surface of the first conductive layer.

10. The display device according to claim 9, wherein the transparent conductive layer is in contact with the end part of the first conductive layer, and a film thickness of the planarization film arranged in the terminal region is thinner than a film thickness of the planarization film arranged in the pixel.

11. The display device according to claim 9, wherein the plurality of terminals is arranged in a zig zag manner along one side of the first substrate.

12. The display device according to claim 9, further comprising a source electrode or a drain electrode above the interlayer insulating layer,
wherein
the interlayer insulating layer including an opening, the opening is arranged above the transistor,
the source electrode or the drain electrode connected with the transistor via the opening, and
the first conductive layer includes the same material as the source electrode or the drain electrode.

13. The display device according to claim 9, wherein the light emitting element includes a pixel electrode, a light emitting layer and a counter electrode, and the pixel electrode includes the same material as the transparent conductive layer.

14. The display device according to claim 1, wherein
the terminal region includes a predetermined substrate on the terminal electrode and the thermosetting resin,
the whole upper surface of the second conductive particle is not in contact with the predetermined substrate, and
the second conductive particle is in an electrically floating state.

15. The display device according to claim 14, wherein
a first distance between the first substrate and a top of the first conductive layer directly below the first conductive particle is larger than a second distance between the first substrate and a top of the planarization film arranged in the side part of the first conductive layer in the terminal region.

16. The display device according to claim 5, wherein
the terminal region includes a predetermined substrate on the terminal electrode and the thermosetting resin,
the whole upper surface of the second conductive particle is not in contact with the predetermined substrate, and
the second conductive particle is in an electrically floating state.

17. The display device according to claim 16, wherein
a first distance between the first substrate and a top of the second conductive layer directly below the first conductive particle is larger than a second distance between the first substrate and a top of the planarization film arranged in the side part of the second conductive layer in the terminal region.

18. The display device according to claim 9, wherein
the terminal region includes a predetermined substrate on the terminal electrode and the thermosetting resin, the whole upper surface of the second conductive particle is not in contact with the predetermined substrate, the second conductive particle is in an electrically floating state.

19. The display device according to claim 18, wherein a first distance between the first substrate and a top of the first conductive layer directly below the first conductive particle is larger than a second distance between the first substrate and a top of the planarization film arranged in the side part of the first conductive layer in the terminal region.

20. The display device according to claim 1, wherein a side surface of the end part of the first conductive layer is in contact with the planarization film.

* * * * *